United States Patent
Kim et al.

(10) Patent No.: US 9,449,547 B2
(45) Date of Patent: Sep. 20, 2016

(54) ORGANIC LIGHT EMITTING DISPLAY

(75) Inventors: Hyung-Soo Kim, Yongin (KR); Soon-Sung Ahn, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 589 days.

(21) Appl. No.: 12/836,528

(22) Filed: Jul. 14, 2010

(65) Prior Publication Data

US 2011/0128268 A1 Jun. 2, 2011

(30) Foreign Application Priority Data

Dec. 1, 2009 (KR) .................. 10-2009-0117879

(51) Int. Cl.
*G09G 5/00* (2006.01)
*G09G 3/32* (2016.01)
*H01L 27/32* (2006.01)

(52) U.S. Cl.
CPC .......... G09G 3/3225 (2013.01); H01L 27/3279 (2013.01); *G09G 2300/0426* (2013.01); *G09G 2320/0223* (2013.01); *G09G 2320/0233* (2013.01); *G09G 2320/0242* (2013.01); *G09G 2330/02* (2013.01); *G09G 2330/06* (2013.01); *H01L 27/3211* (2013.01)

(58) Field of Classification Search
CPC ............... G09G 3/3233; G09G 2300/0842; G09G 2320/043; G09G 2330/02; G09G 2300/0819; G09G 2300/0426; G09G 2300/0861; G09G 2300/0866
USPC .............. 345/76–83, 211; 347/130; 327/108; 315/169.1
See application file for complete search history.

(56) References Cited

U.S. PATENT DOCUMENTS

| 6,771,028 | B1 * | 8/2004 | Winters ................... 315/169.1 |
| 2004/0095168 | A1 * | 5/2004 | Miyazawa .................. 327/108 |
| 2005/0104875 | A1 * | 5/2005 | Kwak et al. ................ 345/204 |
| 2005/0110723 | A1 * | 5/2005 | Shin ............................ 345/76 |
| 2005/0117410 | A1 | 6/2005 | Shin |
| 2005/0179374 | A1 * | 8/2005 | Kwak ........................ 313/506 |
| 2005/0219164 | A1 | 10/2005 | Tanada |
| 2005/0231580 | A1 * | 10/2005 | Yamazaki et al. ........... 347/130 |

(Continued)

FOREIGN PATENT DOCUMENTS

| CN | 1622723 A | 6/2005 |
| CN | 1645445 A | 7/2005 |

(Continued)

OTHER PUBLICATIONS

Extended European Patent Office Search Report dated Oct. 10, 2012 for EP Application No. 10175789.6, 8 pgs.

(Continued)

*Primary Examiner* — Md Saiful A Siddiqui
(74) *Attorney, Agent, or Firm* — Lewis Roca Rothgerber Christie LLP

(57) ABSTRACT

An organic light emitting display includes an image display unit having a plurality of pixels, and first and second pixel power lines that receive pixel-driving voltages from first and second power supplies, respectively. The second pixel power lines are interleaved with the first pixel power lines. Adjacent pixels of the same color from among the plurality of pixels provided in the image display unit are coupled to pixel power lines corresponding to different power supplies. This is to solve or mitigate the problem of non-uniform brightness of the entire image display unit due to voltage drops in the pixel power lines.

15 Claims, 5 Drawing Sheets

(56) References Cited

U.S. PATENT DOCUMENTS

| | | | |
|---|---|---|---|
| 2006/0103611 A1* | 5/2006 | Choi | G09G 3/3233 345/82 |
| 2006/0221007 A1* | 10/2006 | Kim | G09G 3/3225 345/76 |
| 2007/0216613 A1 | 9/2007 | Ogura et al. | |
| 2008/0150846 A1* | 6/2008 | Chung | G09G 3/3233 345/80 |
| 2009/0091521 A1* | 4/2009 | Kanda | G09G 3/3233 345/83 |
| 2010/0277449 A1 | 11/2010 | Kanda | |
| 2011/0241036 A1 | 10/2011 | Yoshinaga et al. | |

FOREIGN PATENT DOCUMENTS

| | | |
|---|---|---|
| CN | 1776795 A | 5/2006 |
| CN | 1816836 A | 8/2006 |
| EP | 1 557 815 A2 | 7/2005 |
| JP | 11-185972 | 7/1999 |
| JP | 11-298036 | 10/1999 |
| JP | 2002-032037 | 1/2002 |
| JP | 2002-299045 | 10/2002 |
| JP | 2003-066868 A | 3/2003 |
| JP | 2003-108068 A | 4/2003 |
| JP | 2005-181703 | 7/2005 |
| JP | 2005-338640 | 12/2005 |
| JP | 2006-146024 | 6/2006 |
| JP | 2006-261058 A | 9/2006 |
| JP | 2006-267766 | 10/2006 |
| JP | 2007-241302 | 9/2007 |
| JP | 2007-248588 A | 9/2007 |
| JP | 2008-209864 | 9/2008 |
| JP | 2009-099485 | 5/2009 |
| JP | 2011-526719 A | 10/2011 |
| KR | 2001-0014501 A | 2/2001 |
| KR | 10-2004-0059037 A | 7/2004 |
| KR | 10-2005-0072007 A | 7/2005 |
| KR | 10-2005-0076734 A | 7/2005 |
| KR | 10-2006-0000754 A | 1/2006 |
| KR | 10-2006-0034574 A | 4/2006 |
| KR | 10-2006-0053693 A | 5/2006 |
| KR | 2006-0065083 A | 6/2006 |
| KR | 10-2006-0091666 A | 8/2006 |
| KR | 10-2007-0042366 | 4/2007 |
| KR | 2008-0010873 A | 1/2008 |
| KR | 10-833753 B1 | 5/2008 |
| WO | WO 2010-001769 A1 | 1/2010 |

OTHER PUBLICATIONS

English machine translation of Japanese Publication 2002-108252, dated Apr. 20, 2002, (previously submitted in an IDS dated Dec. 4, 2012), (12 pages).

Taiwanese Office action dated Aug. 9, 2013, with English translation, for corresponding Taiwanese Patent application 099124877, (15 pages).

Japanese Office Action, Dated Jul. 16, 2012, Issued in Japanese Patent Application No. 2010-095815, 4 Pages.

\* cited by examiner

ORGANIC LIGHT EMITTING DISPLAY

CROSS-REFERENCE TO RELATED APPLICATIONS

This application claims priority to and the benefit of Korean Patent Application No. 10-2009-0117879, filed in the Korean Intellectual Property Office on Dec. 1, 2009, the entire content of which is incorporated herein by reference.

BACKGROUND

1. Field

Aspects of embodiments according to the present invention relate to a flat panel display, and more particularly, to an organic light emitting display.

2. Description of Related Art

Recently, various flat panel displays (FPDs), with reduced weight and volume compared to that of cathode ray tubes (CRTs), have been developed. The FPDs include liquid crystal displays (LCDs), field emission displays (FEDs), plasma display panels (PDPs), and organic light emitting displays.

Among the FPDs, the organic light emitting display has self-emission elements that emit light from phosphors by re-combination of electrons and holes. The organic light emitting display is divided into two categories, a passive matrix organic light emitting display and an active matrix organic light emitting display.

In the active matrix organic light emitting display, a plurality of pixels are arranged in a matrix. Emission of the pixels is controlled using switch elements such as thin film transistors (TFTs) in the pixels. Display is performed through scan lines that select the pixels, data lines for controlling the emission of the pixels, and pixel power lines VDD for supplying voltage (or current) to the pixels.

Ideally, the pixel power lines VDD supply uniform voltage to the plurality of pixels coupled to them. Voltage values applied through the pixel power lines should be equal to each other in terms of the coupled pixels. However, this can be difficult to achieve due to an IR drop (e.g., a voltage drop) generated by the pixel power lines. That is, the voltages supplied to the pixels are reduced due to the IR drop as the distance that the pixels are from an external power supply increases. This is more clearly described with reference to FIG. 1.

FIG. 1 is a block diagram illustrating the structure of a conventional organic light emitting display.

Referring to FIG. 1, the organic light emitting display includes an image display unit 10 for displaying an image, a data driver 20 for transmitting data signals, and a scan driver 30 for transmitting scan signals. In addition, the image display unit 10 includes a plurality of pixels 11 including light emitting elements and pixel circuits, a plurality of scan lines S1, S2, . . . , Sn-1, and Sn arranged in rows, a plurality of data lines D1, D2, . . . , Dm-1, and Dm arranged in columns, a plurality of pixel power lines VDD for supplying power to the plurality of pixels, and a power supply 12 for providing voltages (e.g., predetermined voltages) to the pixel power lines VDD.

The image display unit 10 applies the scan signals transmitted from the scan lines S1, S2, . . . , Sn-1, and Sn and the data signals transmitted from the data lines D1, D2, . . . , Dm-1, and Dm to the pixels. The pixel circuits included in the pixels generate currents corresponding to the data signals and transmit the generated currents to the light emitting elements to display an image.

In this case, a positive pixel-driving voltage from the power supply 12 (in the lower portion of the display, as illustrated in FIG. 1) having a uniform level is applied to the pixels 11 through the pixel power lines VDD. As illustrated in FIG. 1, some of the pixels 10 are further from the power supply 12 (for example, pixels in the upper portion of the display) for applying pixel-driving voltages than others (for instance, pixels in the lower portion). Therefore, due to a non-uniformity of line resistance in accordance with lengths of the pixel power lines VDD commonly coupled to the power supply 12, the magnitudes of the IR drops of the pixel-driving voltages supplied to the pixels 11 are different from each other.

That is, the magnitude of the IR drop of the pixel power lines VDD is smaller when the pixel is closer to the power supply 12, while the magnitude of the voltage drop of the pixel power line VDD increases the further the pixel is from the power supply 12.

Therefore, the conventional organic light emitting display has a shortcoming in that the amount of current delivered to a pixel 11 for the same data signal varies in accordance with the position of the pixel 11 due to the non-uniformity of the IR drop of the pixel power lines VDD. Consequently, emission brightness becomes non-uniform. Such a problem becomes serious as the size of a panel increases.

SUMMARY

Accordingly, embodiments of the present invention provide an organic light emitting display that includes first pixel power lines that receive pixel-driving voltages from a first power supply and second pixel power lines arranged between the first pixel power lines to receive pixel-driving voltages from a second power supply. Adjacent pixels of the same color among the plurality of pixels provided in an image display unit are coupled to pixel power lines that are coupled to different power supplies. This prevents or reduces the problem of non-uniform brightness of the entire image display unit due to the IR drop of pixel power lines.

According to an exemplary embodiment of the present invention, an organic light emitting display is provided. The organic light emitting display includes an image display unit, a plurality of pixel power lines, and first and second power supplies. The image display unit includes a plurality of pixels. The plurality of pixel power lines includes first pixels power lines and second pixel power lines for transmitting pixel-driving voltages to the plurality of pixels. The first and second power supplies are for providing the pixel-driving voltages to the first pixel power lines and the second pixel power lines, respectively. Adjacent pixels of a same color from among the plurality of pixels included in the image display unit are coupled to different ones of the power supplies via respective ones of the pixel power lines.

The first pixel power lines and the second pixel power lines may extend in opposite directions.

The first pixel power lines may extend from a first side of the image display unit to a second side of the image display unit that is opposite the first side of the image display unit. The second pixel power lines may extend from the second side of the image display unit to the first side of the image display unit and are interleaved with the first pixel power lines.

The first pixel power lines may correspond to odd columns of the pixels of the image display unit. The second pixel power lines may correspond to even columns of the pixels of the image display unit.

Pixels in an odd row from among the plurality of pixels may be coupled to respective ones of the plurality of pixel power lines on a first side of the pixels in the odd row. Pixels in an even row from among the plurality of pixels may be coupled to respective ones of the plurality of pixel power lines on a second side of the pixels in the even row. The second side of the pixels is opposite the first side of the pixels.

The pixels may be arranged in unit pixels, each including adjacent red (R), green (G), and blue (B) pixels of the plurality of pixels, such that the pixels of each of the unit pixels are coupled to adjacent ones of the plurality of pixel power lines coupled to a same one of the power supplies, and that two of the pixels of each of the unit pixels are coupled to a same one of the plurality of pixel power lines.

The unit pixels may be arranged in rows, and the red pixel of each of the unit pixels in an odd row among the plurality of rows is coupled to a respective one of the plurality of pixel power lines, and the green and blue pixels of each of the unit pixels in the odd row are coupled to a respective another one of the plurality of pixel power lines.

The red and green pixels of each of the unit pixels in an even row among the plurality of rows may be coupled to a respective one of the plurality of pixel power lines, and the blue pixel of each of the unit pixels in the even row is coupled to a respective another one of the plurality of pixel power lines.

The pixel-driving voltages provided by the first and second power supplies may be positive voltages of a same level.

The pixels may be arranged in rows and columns, and the adjacent pixels of the same color include two pixels of the same color in a same row or column from among the plurality of pixels with no intervening pixels of the same color.

The colors may include red (R), green (G), and blue (B), and each of the pixels in a same column are of a same color.

The organic light emitting display may further include a plurality of first and second auxiliary pixel power lines crossing the first and second pixel power lines.

The first auxiliary pixel power lines may be coupled to the first pixel power lines at crossing points of the first auxiliary pixel power lines and the first pixel power lines, the first auxiliary pixel power lines and the first pixel power lines being configured in a mesh type arrangement. The second auxiliary pixel power lines may be interleaved with the first auxiliary pixel power lines and are coupled to the second pixel power lines at crossing points of the second auxiliary pixel power lines and the second pixel power lines, the second auxiliary pixel power lines and the second pixel power lines being configured in a mesh type arrangement.

The first and second auxiliary pixel power lines may include a metal material having a low resistivity and may be located in different layers from the first and second pixel power lines.

Contact holes may be located at crossing points of the first auxiliary pixel power lines and the first pixel power lines and at crossing points of the second auxiliary pixel power lines and the second pixel power lines so that the first and second auxiliary pixel power lines are electrically coupled to the first and second pixel power lines, respectively.

As described above, according to aspects of the present invention, the total distance of respective pixel power lines coupled to adjacent pixels of the same color is made uniform. This helps prevent or reduce the problem of the brightness of the entire image display unit becoming non-uniform due to the IR drop of the pixel power lines.

BRIEF DESCRIPTION OF THE DRAWINGS

The accompanying drawings, together with the specification, illustrate exemplary embodiments of the present invention and, together with the description, serve to explain the principles of aspects of the present invention.

DETAILED DESCRIPTION

Figure 1:
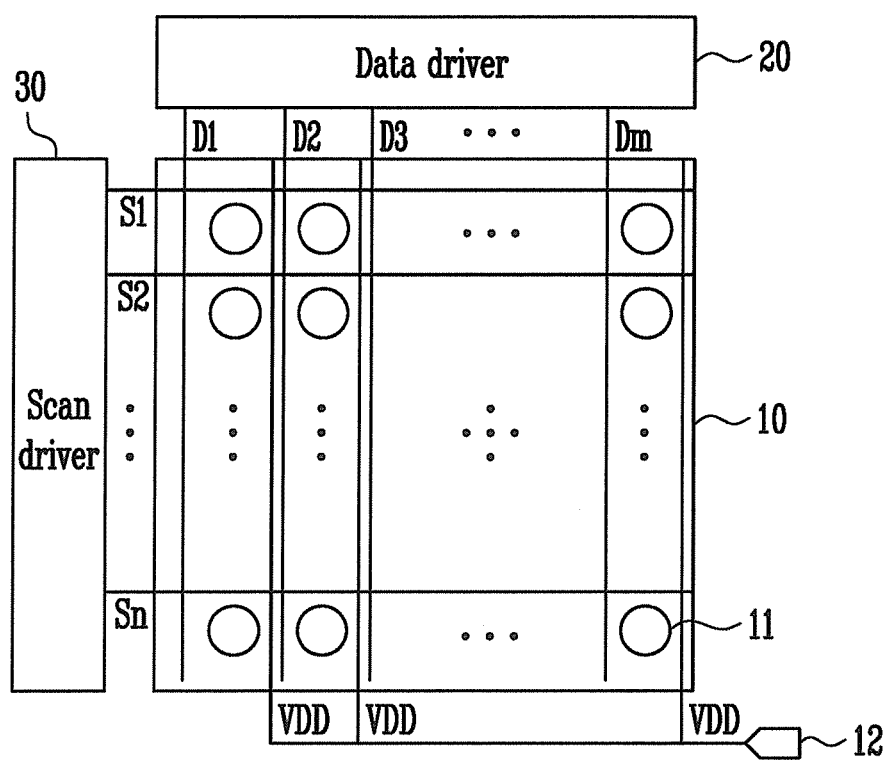
FIG. 1 is a block diagram illustrating the structure of a conventional organic light emitting display.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on another element or be indirectly on another element with one or more intervening elements interposed therebetween. Also, when an element is referred to as being "coupled to" another element, it can be directly connected to another element or be indirectly connected to another element with one or more intervening elements interposed therebetween. Hereinafter, like reference numerals refer to like elements.

Hereinafter, the embodiments of the present invention will be described in detail with reference to the accompanying drawings.

Figure 2:
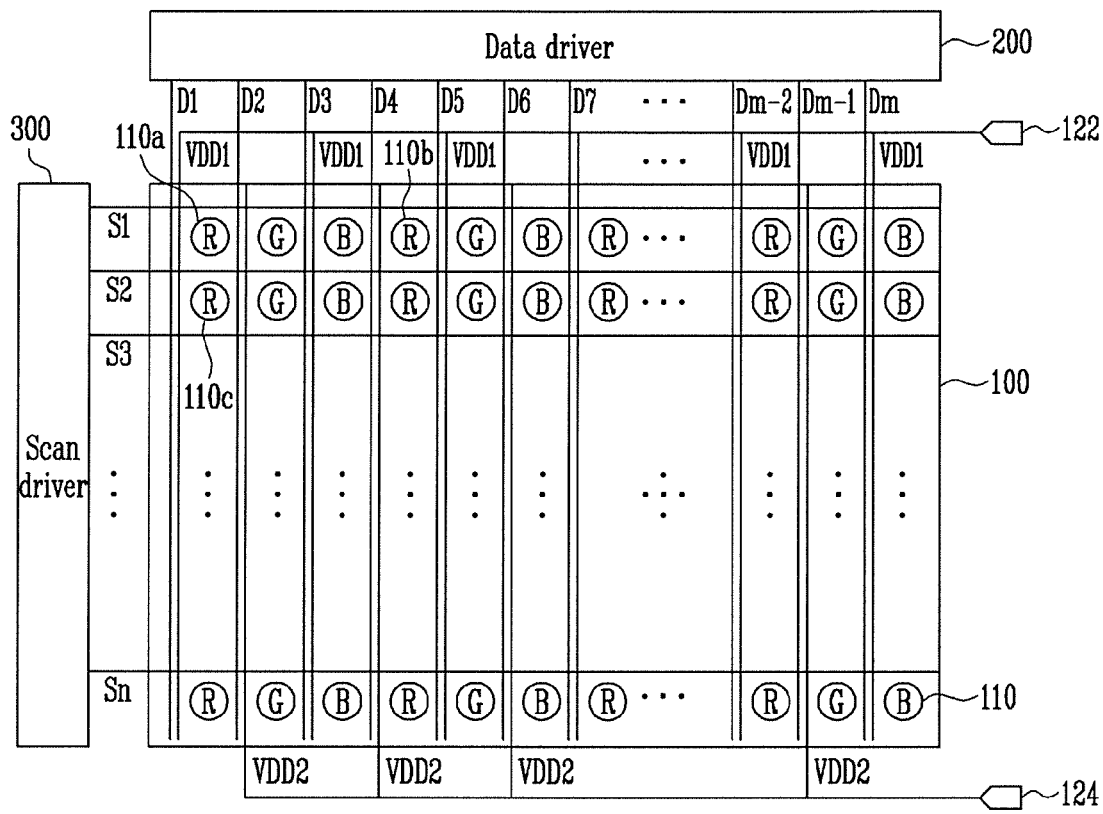
FIG. 2 is a block diagram illustrating the structure of an organic light emitting display according to an embodiment of the present invention.

FIG. 2 is a block diagram illustrating the structure of an organic light emitting display according to an embodiment of the present invention.

Referring to FIG. 2, the organic light emitting display includes an image display unit 100 for displaying an image, a data driver 200 for transmitting data signals, and a scan driver 300 for transmitting scan signals.

In addition, the image display unit 100 includes a plurality of pixels 110 including light emitting elements and pixel circuits; a plurality of scan lines S1, S2, . . . , Sn−1, and Sn arranged in rows; a plurality of data lines D1, D2, . . . , Dm−1, and Dm arranged in columns; first and second pixel power lines VDD1 and VDD2 for transmitting pixel-driving voltages to the plurality of pixels and extending from the upper and lower portions of the display, respectively; and first and second power supplies 122 and 124 for providing the pixel-driving voltages to the first and second pixel power lines VDD1 and VDD2, respectively.

In particular, according to the embodiment shown in FIG. 2, pixel power lines for transmitting the pixel-driving voltages to the pixels are divided into the first pixel power lines VDD1 and the second pixel power lines VDD2 arranged to extend (deliver power) in opposite directions toward the opposite side of the image display unit 100.

That is, as illustrated in FIG. 2, the first pixel power lines VDD1 extend from the upper side of the image display unit 100 to the lower side of the image display unit 100 while the second pixel power lines VDD2 extend from the lower side of the image display unit 100 to the upper side of the image display unit 100. The first pixel power lines VDD1 and the second pixel power lines VDD2 alternate, such that, except at the edges, each first power line VDD1 is between a pair of second power lines VDD2 and each second power line VDD2 is between a pair of first power lines VDD1. That is, the first and second power pixel lines VDD1 and VDD2 are interleaved.

In addition, the first pixel power lines VDD1 receive the pixel-driving voltages from the first power supply 122 to transmit the received pixel-driving voltages to the pixels 110 provided in the image display unit 100 while the second pixel power lines VDD2 receive the pixel-driving voltages from the second power supply 124 to transmit the received pixel-driving voltages to the pixels 110 included in the image display unit 100.

Thus, the magnitude of the IR drop of the first pixel power lines VDD1 increases toward the lower region of the image display unit 100, which is further from the first power supply 122 than the upper region of the image display unit 100. On the contrary, the magnitude of the IR drop of the second pixel power VDD2 increases toward the upper region of the image display unit 100, which is further from the second power supply 124 than the lower region of the image display unit 100.

Therefore, it is possible to prevent or reduce the variation in brightness of the image display unit that takes place due to a difference in the IR drops of the pixel power lines when the pixel-driving voltages are supplied to the pixels through pixel power lines extending only in the same direction.

The pixel-driving voltages provided by the first and second power supplies 122 and 124 are positive voltages of a same level so that the first and second power supplies 122 and 124 may be realized by one device.

In addition, each of the pixels 110 included in the image display unit 100 is coupled to either a first pixel power line VDD1 or a second pixel power line VDD2. According to some embodiments of the present invention, adjacent pixels of the same color (for example, in the same column and next to each other, or in the same row with only intervening pixels of different colors between them) among the plurality of pixels 110 included in the image display unit 100 are coupled to different pixel power lines VDD1 and VDD2.

That is, continuing to refer to FIG. 2, in the case where one each of red (R), green (G), and blue (B) pixels realize one unit pixel, when it is assumed that a first red pixel 110a included in a first unit pixel is coupled to the first pixel power line VDD1, second red pixels 110b and 110c included in second unit pixels adjacent to the top, bottom, left, and right of the first unit pixel are not coupled to the first pixel power lines VDD1 but rather to the second pixel power lines VDD2.

Through such coupling, when the magnitude of the IR drop of the first pixel power line VDD1 coupled to the first red pixel 110a is small, the magnitude of the IR drop of the second pixel power lines VDD2 coupled to the second red pixels 110b and 110c is relatively large. As a result, since the distance from the pixel power lines to adjacent pixels of the same color, that is, the magnitude of line resistance, is relatively uniform, it is possible to prevent or reduce the brightness of the image display unit from being non-uniform due to the IR drop of the pixel power lines.

Figure 3:
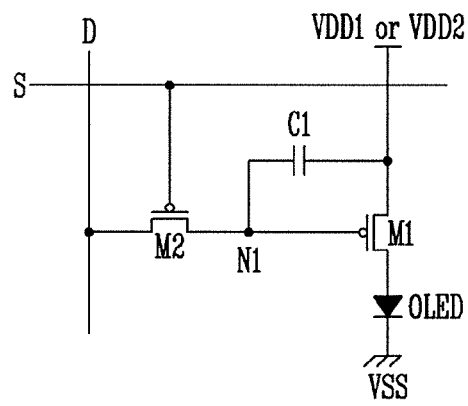
FIG. 3 is a circuit diagram illustrating the structure of an embodiment of the pixel of FIG. 2.

FIG. 3 is a circuit diagram illustrating the structure of an embodiment of the pixel of FIG. 2.

FIG. 3 is one embodiment of the structure of the pixel according to the embodiment of FIG. 2, but the structure of the pixel is not limited to the embodiment of FIG. 3.

Referring to FIG. 3, the pixel includes a pixel circuit and a light emitting element. The pixel circuit includes a first transistor M1, a second transistor M2, and a capacitor C1. The first transistor M1 and the second transistor M2 include sources, drains, and gates. The capacitor C1 includes a first electrode and a second electrode.

The source of the first transistor M1 is coupled to the first pixel power line VDD1 or the second pixel power line VDD2. The drain of the first transistor M1 is coupled to an anode electrode of an organic light emitting diode (OLED). The gate of the first transistor M1 is coupled to a first node N1. In addition, the first node N1 is coupled to the drain of the second transistor M2. The first transistor M1 supplies the current corresponding to a data signal to the OLED. A base power VSS is coupled to a cathode electrode of the OLED.

In addition, the source of the second transistor M2 is coupled to a data line D, the drain of the second transistor M2 is coupled to the first node N1, and the gate of the second transistor M2 is coupled to a scan line S. In accordance with the scan signal applied to the gate, the data signal is transmitted to the first node N1.

The first electrode of the capacitor C1 is coupled to the first power supply line VDD1 or the second power supply line VDD2 and the second electrode is coupled to the first node N1. Therefore, the capacitor C1 charges a charge in accordance with the data signal applied to the pixel and applies a gate signal of the first transistor M1 in a frame in accordance with the charge so that the operation of the first transistor M1 is maintained in the frame.

Figure 4A:
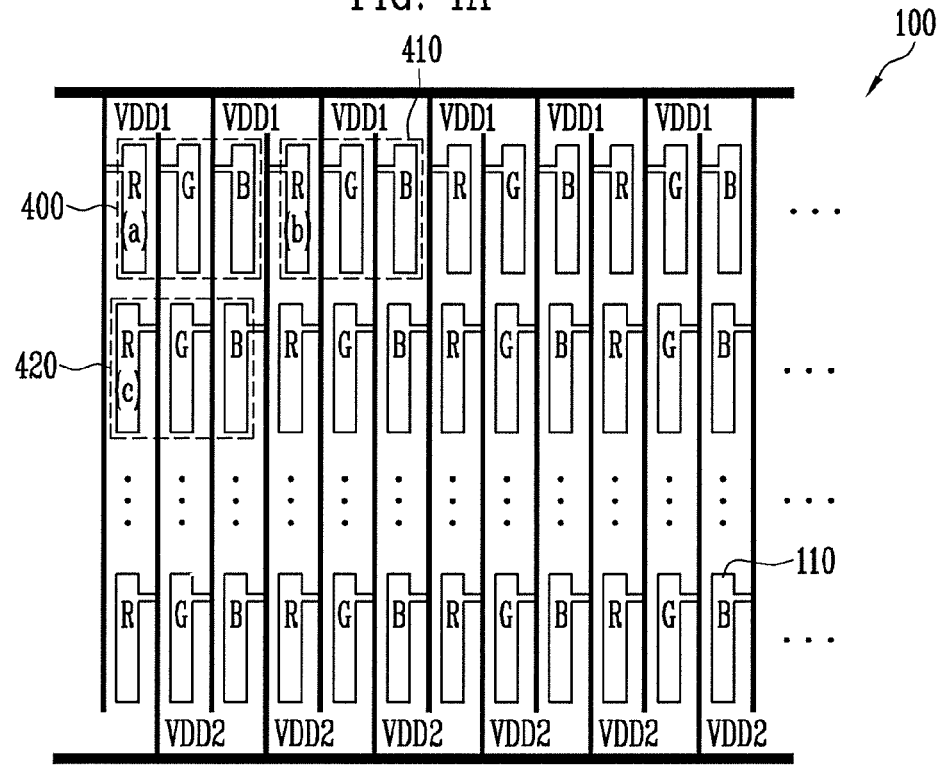
FIGS. 4A and 4B are views illustrating a coupling relationship between first and second pixel power lines and the pixels according to the embodiment illustrated in FIG. 2 in detail.
Figure 4B:
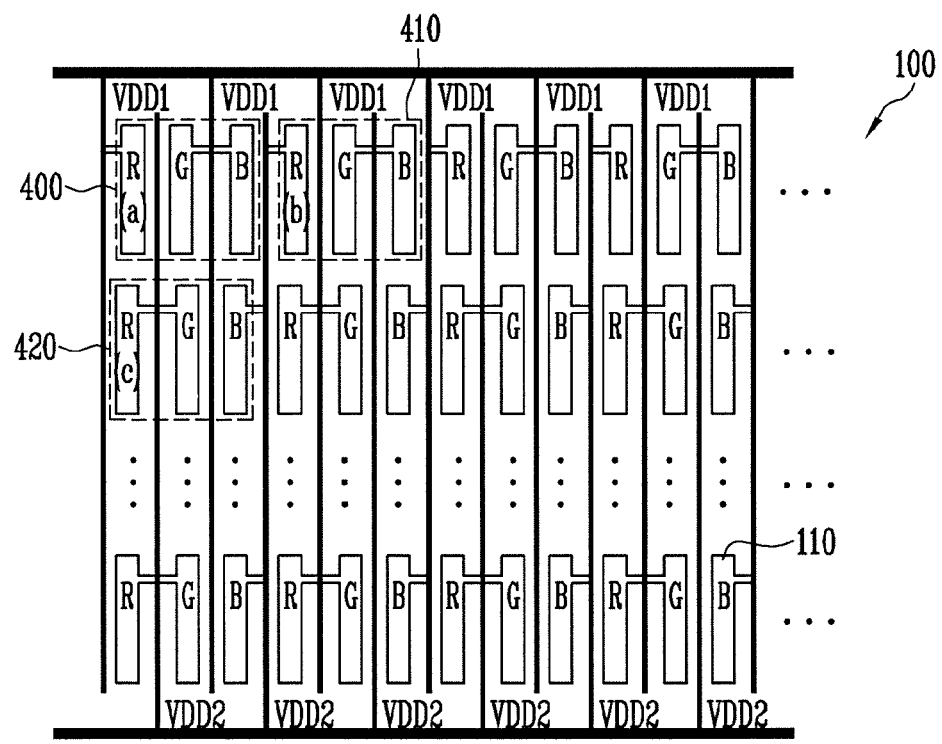

FIGS. 4A and 4B are views illustrating a coupling relationship between first and second pixel power lines and the pixels according to the embodiment illustrated in FIG. 2 in detail.

In FIGS. 4A and 4B, for ease of illustration, the arrangement of scan lines and data lines is omitted.

Referring to FIGS. 4A and 4B, the first pixel power lines VDD1 positioned on the upper side of the image display unit 100 extend downward and the second pixel power lines VDD2 positioned on the lower side of the image display unit 100 extend upward and interleave the first pixel power lines VDD1. That is, the first pixel power lines VDD1 are arranged to correspond to odd columns of the image display unit 100 and the second pixel power lines VDD2 are arranged to correspond to even columns of the image display unit 100.

According to the embodiment of FIG. 4A, for the plurality of pixels 110 included in the image display unit 100, the pixels arranged in an odd row are coupled to the pixel power lines arranged on a first side, that is, on the left side of the respective pixels while the pixels arranged in an even row are coupled to the pixel power lines arranged on a second side, that is, on the right side of the respective pixels. For example, in one embodiment, adjacent sets of one each of red (R), green (G), and blue (B) pixels 110 realize one unit pixel (for example, unit pixels 400, 410, and 420). Thus, in the embodiment of FIG. 4A, no two pixels in the same unit pixel share the same pixel power line. In addition, pixel power lines from both the first pixel power lines VDD1 and the second pixel power lines VDD2 supply power to the three pixels of each of the unit pixels.

By comparison, according to the embodiment of FIG. 4B, two pixels among the three pixels that constitute each unit pixel are arranged to share an adjacent pixel power line. In addition, pixel power lines from only one of the first pixel power lines VDD1 or the second pixel power lines VDD2 supply power to the three pixels of each of the unit pixels.

That is, referring to FIG. 4B, the odd unit pixels (for example, unit pixel 400) arranged in the odd rows are coupled to the first pixel power lines VDD1. For instance, if the red pixel of a unit pixel is coupled to the ith (i is an integer, i≤m/2−1) first pixel power line VDD1, then the green and blue pixels of the same unit pixel are coupled to share the (i+1)th first pixel power line VDD1. In addition, the even unit pixels (for example, unit pixel 410) arranged in the odd rows are coupled to the second pixel power lines VDD2. For instance, if the red pixel of a unit pixel is coupled to the ith second pixel power line VDD2, then the green and blue pixels of the same unit pixel are coupled to share the (i+1)th second pixel power line VDD2.

Furthermore, the odd unit pixels (for example, unit pixel 420) arranged in the even rows are coupled to the second pixel power lines VDD2. For instance, if the red and green pixels of a unit pixel are coupled to share the jth (j is an integer, j≤m/2−1) second pixel power line VDD2, then the blue pixel of the same unit pixel is coupled to the (j+1)th second power line VDD2. In addition, the even unit pixels arranged in the even rows are coupled to the first pixel power lines VDD1 in a similar fashion.

As described in the above embodiments, the pixels included in the image display unit 100 are coupled to the first pixel power lines VDD1 (supplied by the first power supply 122) or the second pixel power lines VDD2 (supplied by the second power supply 124) so that the adjacent pixels of the same color among the plurality of pixels 110 included in the image display unit 100 are coupled to pixel power lines that are coupled to different power supplies.

Referring to FIGS. 4A and 4B, when a first unit pixel 400 positioned on the uppermost side and on the right side of the image display unit is taken as an example, the first red pixel a included in the first unit pixel 400 is coupled to a first pixel power line VDD1, the second red pixel b included in a second unit pixel 410 adjacent to the first unit pixel 400 in a row direction is coupled to a second pixel power line VDD2, and a third red pixel c included in a third unit pixel 420 adjacent to the first unit pixel 400 in a column direction is coupled to a second pixel power line VDD2 (different from the second pixel power line VDD2 coupled to the second red pixel b).

In this case, the magnitude of the IR drop of the first pixel power line VDD1 coupled to the first red pixel a is small and the magnitudes of the IR drops of the second pixel power lines VDD2 coupled to the second red pixel b and the third red pixel c are large. As a result, since the total distance from the power supplies via the pixel power lines to the adjacent pixels of the same color, that is, the magnitude of the line resistance, is relatively uniform, it is possible to prevent or reduce the non-uniform brightness of the entire image display unit due to the IR drop of the pixel power lines.

Figure 5:
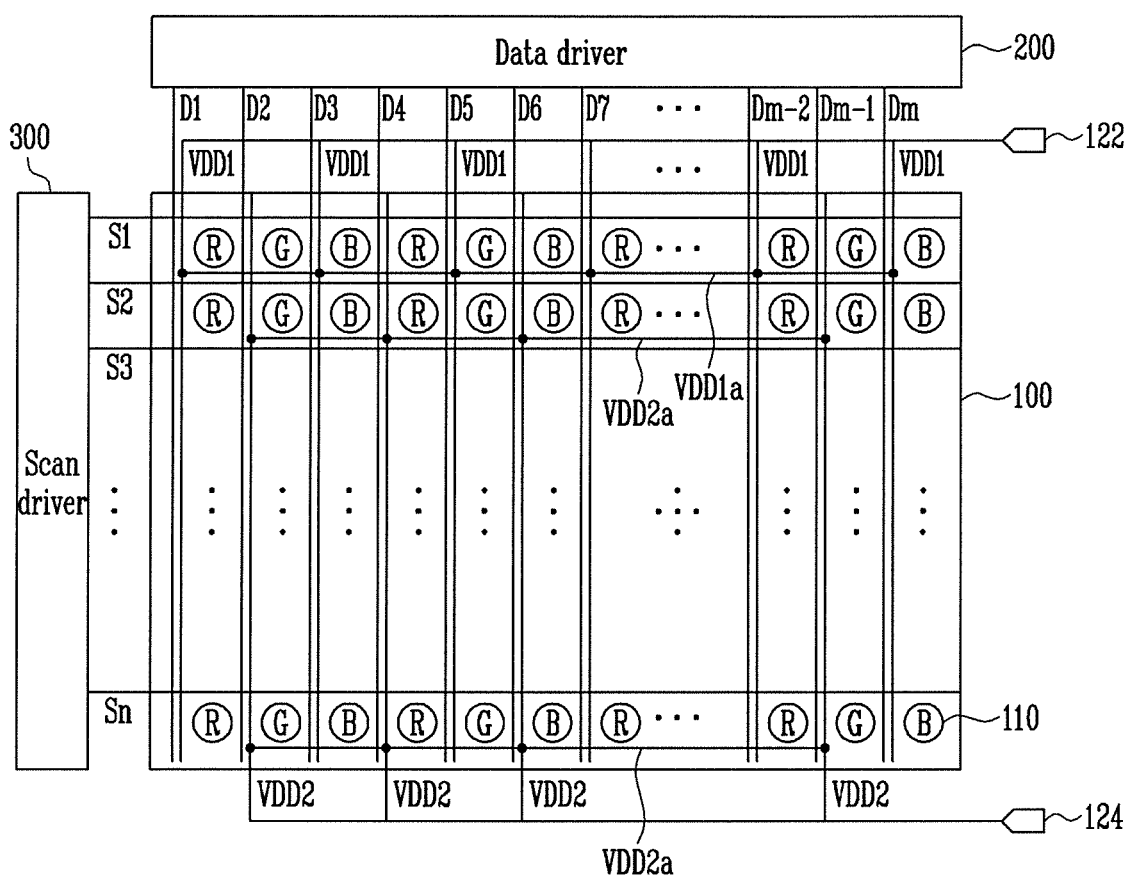
FIG. 5 is a block diagram illustrating the structure of an organic light emitting display according to another embodiment of the present invention.

FIG. 5 is a block diagram illustrating the structure of an organic light emitting display according to another embodiment of the present invention.

According to the embodiment of FIG. 5, in comparison with the embodiment of FIG. 2, in order to reduce or prevent the apparent brightness non-uniformity caused by the IR drop of the pixel power lines with respect to the first and second pixel power lines VDD1 and VDD2 arranged in a first direction, first and second auxiliary pixel power lines VDD1a and VDD2a arranged in a second direction crossing the first direction (for example, perpendicular to the first direction) are additionally formed or provided. Since the other elements and coupling relationships are the same as the embodiment of FIG. 2, like reference numerals refer to like elements and description of the elements will be omitted.

That is, the first auxiliary pixel power lines VDD1a are arranged in the second direction to be coupled to the first pixel power lines VDD1 in a mesh type arrangement. Likewise, the second auxiliary pixel power lines VDD2a are arranged between the first auxiliary pixel power lines VDD1a to be coupled to the second pixel power lines VDD2 in a similar mesh type arrangement.

At this time, the first and second auxiliary pixel power lines VDD1a and VDD2a may be made of a metal material having a low resistivity value. The first and second auxiliary pixel power lines VDD1a and VDD2a are electrically coupled (at crossing points) to the first and second pixel power lines VDD1 and VDD2, respectively, to reduce the line resistance of the first and second pixel power lines VDD1 and VDD2 and to reduce or prevent the apparent brightness non-uniformity due to the IR drop caused by the first and second pixel power lines VDD1 and VDD2.

To reduce or prevent problems like short circuits, the first and second auxiliary pixel power lines VDD1a and VDD2a are formed or located in different layers from the first and second pixel power lines VDD1 and VDD2, respectively. Thus, contact holes, for example, are formed at the intersections (crossing regions) between the first auxiliary pixel power lines VDD1a and the first pixel power lines VDD1 and at the intersections between the second auxiliary pixel power lines VDD2a and the second pixel power lines VDD2 so that the first and second auxiliary pixel power lines VDD1a and VDD2a are electrically coupled to the first and second pixel power lines VDD1 and VDD2, respectively.

Figure 6:
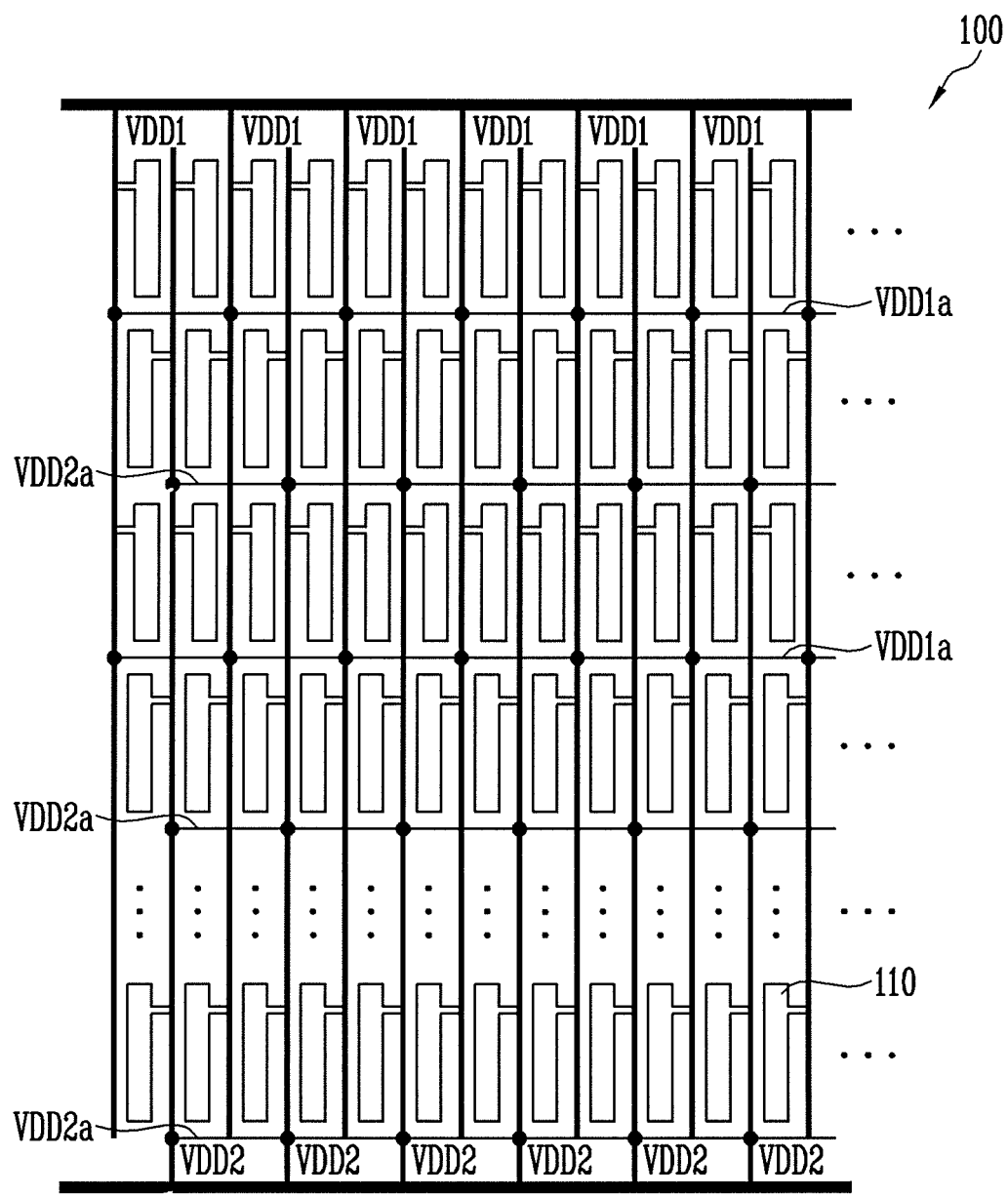
FIG. 6 is a view illustrating a coupling relationship among the first and second pixel power lines, first and second auxiliary pixel power lines, and the pixels according to the embodiment of FIG. 5.

FIG. 6 is a view illustrating a coupling relationship among the first and second pixel power lines, first and second auxiliary pixel power lines, and the pixels according to the embodiment of FIG. 5.

In FIG. 6, for simplicity of illustration, the arrangement of the scan lines and the data lines is omitted. It should be noted that the first and second auxiliary pixel power lines VDD1a and VDD2a in FIG. 6 may be added to the embodiment of FIG. 4A and may also be applied to the embodiment of FIG. 4B.

Referring to FIG. 6, the first pixel power lines VDD1 positioned on the upper side of the image display unit 100 extend from the upper side to the lower side and the second pixel power lines VDD2 positioned on the lower side of the image display unit 100 extend from the lower side to the upper side and are arranged to be interleaved with the first pixel power lines VDD1. That is, the first pixel power lines VDD1 are arranged to correspond to the odd columns of the image display unit 100 and the second pixel power lines VDD2 are arranged to correspond to the even columns of the image display unit 100.

In addition, the first auxiliary pixel power lines VDD1a are arranged in a row direction to be coupled to the first pixel power lines VDD1 in a mesh type arrangement. The second auxiliary pixel power lines VDD2a are arranged between the first auxiliary pixel power lines VDD1a to be coupled to the second pixel power lines VDD2 in a similar mesh type arrangement.

That is, the first auxiliary pixel power lines VDD1*a* are arranged to correspond to the odd rows of the image display unit to be coupled to the first pixel power lines VDD1 to form a mesh or grid. In addition, the second auxiliary pixel power lines VDD2*a* are arranged to correspond to the even rows of the image display unit to be coupled to the second pixel power lines VDD2 to form a similar mesh or grid.

Here, since the first and second auxiliary pixel power lines VDD1*a* and VDD2*a* are formed in different layers from the first and second pixel power lines VDD1 and VDD2, respectively, contact holes are formed at the intersections between the first auxiliary pixel power lines VDD1*a* and the first pixel power lines VDD1 and at the intersections between the second auxiliary pixel power lines VDD2*a* and the second pixel power lines VDD2 as illustrated in FIG. 6 so that the first and second auxiliary pixel power lines VDD1*a* and VDD2*a* are electrically coupled to the first and second pixel power lines VDD1 and VDD2, respectively.

In addition, according to the embodiment of FIG. 6, like in the embodiment of FIG. 4A, for plurality of pixels 110 included in the image display unit 100, the pixels arranged in the odd rows are coupled to the pixel power lines arranged on a first side, that is, on the left side of the respective pixels and the pixels arranged in the even rows are coupled to the pixel power lines arranged on a second side, that is, on the right side of the respective pixels.

According to embodiments of the present invention, when the pixels 110 included in the image display unit 100 are coupled to the first pixel power lines VDD1 supplied by the first power supply 122 or the second pixel power lines VDD2 supplied by the second power supply 124, the adjacent pixels of the same color among the plurality of pixels 110 included in the image display unit 100 are coupled to pixel power lines that are coupled to different power supplies.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display comprising:
   an image display unit comprising a plurality of pixels arranged in rows and columns;
   a plurality of pixel power lines comprising first pixel power lines and second pixel power lines for transmitting a pixel-driving voltage of a first level to the plurality of pixels, wherein the first pixel power lines alternate with the second pixel power lines in a direction crossing the plurality of pixel power lines and the first pixel power lines are not coupled to the second power lines; and
   a first power supply for providing the pixel-driving voltage of the first level to the first pixel power lines; and
   a second power supply for providing the pixel-driving voltage of the first level to the second pixel power lines,
   wherein in each of the rows and columns, two pixels of a same color with no intervening pixels of the same color from among the plurality of pixels included in the image display unit are coupled to different ones of the power supplies via respective ones of the plurality of pixel power lines.

2. The organic light emitting display as claimed in claim 1, wherein the first pixel power lines and the second pixel power lines extend in opposite directions.

3. The organic light emitting display as claimed in claim 2,
   wherein the first pixel power lines extend from a first side of the image display unit to a second side of the image display unit that is opposite the first side of the image display unit, and
   wherein the second pixel power lines extend from the second side of the image display unit to the first side of the image display unit and are interleaved with the first pixel power lines.

4. The organic light emitting display as claimed in claim 3,
   wherein the first pixel power lines correspond to odd columns of the pixels of the image display unit, and
   wherein the second pixel power lines correspond to even columns of the pixels of the image display unit.

5. The organic light emitting display as claimed in claim 4, wherein pixels in an odd row from among the plurality of pixels are coupled to the respective ones of the plurality of pixel power lines on a first side of the pixels in the odd row, and pixels in an even row from among the plurality of pixels are coupled to the respective ones of the plurality of pixel power lines on a second side of the pixels in the even row, the second side of the pixels in the even row being opposite to the first side of the pixels in the odd row.

6. The organic light emitting display as claimed in claim 1, wherein the pixel-driving voltage provided by the first and second power supplies is a positive voltage.

7. The organic light emitting display as claimed in claim 1, wherein the colors comprise red (R), green (G), and blue (B), and each of the pixels in a same column are of a same color.

8. The organic light emitting display as claimed in claim 1, further comprising a plurality of first and second auxiliary pixel power lines crossing the first and second pixel power lines.

9. The organic light emitting display as claimed in claim 8,
   wherein the first auxiliary pixel power lines are coupled to the first pixel power lines at crossing points of the first auxiliary pixel power lines and the first pixel power lines, the first auxiliary pixel power lines and the first pixel power lines being configured in a mesh type arrangement, and
   wherein the second auxiliary pixel power lines are interleaved with the first auxiliary pixel power lines and are coupled to the second pixel power lines at crossing points of the second auxiliary pixel power lines and the second pixel power lines, the second auxiliary pixel power lines and the second pixel power lines being configured in a mesh type arrangement.

10. The organic light emitting display as claimed in claim 8, wherein the first and second auxiliary pixel power lines comprise a metal material having a low resistivity and are located in different layers from the first and second pixel power lines.

11. The organic light emitting display as claimed in claim 10, wherein contact holes are located at crossing points of the first auxiliary pixel power lines and the first pixel power lines and at crossing points of the second auxiliary pixel power lines and the second pixel power lines so that the first and second auxiliary pixel power lines are electrically coupled to the first and second pixel power lines, respectively.

12. An organic light emitting display comprising:
   an image display unit comprising a plurality of pixels;

a plurality of pixel power lines comprising first pixel power lines and second pixel power lines for transmitting pixel-driving voltages to the plurality of pixels; and a first power supply and a second power supply for providing the pixel-driving voltages to the first pixel power lines and the second pixel power lines, respectively, wherein adjacent pixels of a same color from among the plurality of pixels included in the image display unit are coupled to different ones of the power supplies via respective ones of the pixel power lines, wherein the first pixel power lines and the second pixel power lines extend in opposite directions, wherein the first pixel power lines extend from a first side of the image display unit to a second side of the image display unit that is opposite the first side of the image display unit, wherein the second pixel power lines extend from the second side of the image display unit to the first side of the image display unit and are interleaved with the first pixel power lines, wherein the first pixel power lines correspond to odd columns of the pixels of the image display unit, wherein the second pixel power lines correspond to even columns of the pixels of the image display unit, and wherein the pixels are arranged in unit pixels, each comprising adjacent red (R), green (G), and blue (B) pixels of the plurality of pixels, such that the pixels of each of the unit pixels are coupled to adjacent ones of the plurality of pixel power lines coupled to a same one of the power supplies, and that two of the pixels of each of the unit pixels are coupled to a same one of the plurality of pixel power lines.

13. The organic light emitting display as claimed in claim 12, wherein the unit pixels are arranged in a plurality of rows, and the red pixel of each of the unit pixels in an odd row among the plurality of rows is coupled to a respective one of the plurality of pixel power lines, and the green and blue pixels of each of the unit pixels in the odd row are coupled to a respective another one of the plurality of pixel power lines.

14. The organic light emitting display as claimed in claim 13, wherein the red and green pixels of each of the unit pixels in an even row among the plurality of rows are coupled to a respective one of the plurality of pixel power lines, and the blue pixel of each of the unit pixels in the even row is coupled to a respective another one of the plurality of pixel power lines.

15. An organic light emitting display comprising:
an image display unit comprising a plurality of pixels of a plurality of colors and arranged along a first direction and along a second direction crossing the first direction;
a plurality of pixel power lines extending along the first direction and comprising first pixel power lines and second pixel power lines for transmitting a pixel-driving voltage of a same first level to the plurality of pixels, wherein the first pixel power lines alternate with the second pixel power lines in the second direction and the first pixel power lines are not coupled to the second power lines; and
a first power supply for providing the pixel-driving voltage of the first level to the first pixel power lines; and
a second power supply for providing the pixel-driving voltage of the first level to the second pixel power lines,
wherein pixels of a same one of the colors from among the plurality of pixels included in the image display unit couple in alternation to the first pixel power lines and to the second pixel power lines along both the first and second directions.

* * * * *